(12) United States Patent
Wei et al.

(10) Patent No.: US 8,917,112 B1
(45) Date of Patent: Dec. 23, 2014

(54) BIDIRECTIONAL LEVEL SHIFTER

(71) Applicants: Chinyuan Wei, Miaoli (TW); Shiueshr Jiang, Changhua (TW)

(72) Inventors: Chinyuan Wei, Miaoli (TW); Shiueshr Jiang, Changhua (TW)

(73) Assignee: Richtek Technology Corporation, Chupei, Hsinchu (TW)

( * ) Notice: Subject to any disclaimer, the term of this patent is extended or adjusted under 35 U.S.C. 154(b) by 7 days.

(21) Appl. No.: 14/014,079

(22) Filed: Aug. 29, 2013

(51) Int. Cl.
*H03K 19/0175* (2006.01)
*H03K 19/0185* (2006.01)
*H03K 19/003* (2006.01)
*G11C 7/10* (2006.01)
*G11C 11/4093* (2006.01)

(52) U.S. Cl.
CPC .... *H03K 19/01759* (2013.01); *H03K 19/00361* (2013.01); *H03K 19/0185* (2013.01)
USPC .................. 326/63; 326/62; 326/86; 326/131; 326/133; 327/333; 710/51

(58) Field of Classification Search
USPC ............ 326/63, 62, 86, 131, 133; 710/36, 51, 710/52; 327/333
See application file for complete search history.

(56) References Cited

U.S. PATENT DOCUMENTS 5,149,991 A * 9/1992 Rogers ............................ 326/27
7,822,890 B2 * 10/2010 Hwang et al. .................... 710/51

* cited by examiner

*Primary Examiner* — Alexander H Taningco
*Assistant Examiner* — Rupert Wilmot-Dunbar, Jr.
(74) *Attorney, Agent, or Firm* — Tung & Associates

(57) ABSTRACT

The invention provides a bidirectional level shifter which includes: a first signal terminal; a second signal terminal; a first switch, coupled between the first signal terminal and ground; an inverter receiving a signal from the first signal terminal; a Schottky diode including an anode and a cathode, the anode receiving a signal from the second signal terminal; a second switch, coupled between the cathode of the Schottky diode and the ground; a comparing circuit, comparing a reference voltage and a voltage at the second signal terminal to control the first switch, wherein the reference voltage is lower than a forward bias voltage of the Schottky diode; a first voltage source coupled to the first common node; and a second voltage source coupled to the second common node.

8 Claims, 3 Drawing Sheets

BIDIRECTIONAL LEVEL SHIFTER

BACKGROUND OF THE INVENTION

1. Field of Invention

The present invention relates to a bidirectional level shifter, especially a bidirectional level shifter using a Schottky diode to provide a voltage difference.

2. Description of Related Art

A bidirectional level shifter is a commonly used signal input/output device, for example, used for bidirectional serial data transmission. FIG. 1 shows a bidirectional level shifter 10 disclosed by U.S. Pat. No. 7,822,890, wherein one of the signal terminal I/O (a) and the signal terminal I/O(b) can be a signal input terminal, and the other can be a signal output terminal. The bidirectional level shifter 10 includes two switches M1 and M2, an inverter 11, and a comparator 12. The voltage Vt is a low reference voltage between a logic high voltage level and a logic low voltage level of the input signal to the signal terminal I/O (b) when the signal terminal I/O(b) acts as the input terminal, and the voltage Vp is a low voltage slightly higher than the voltage Vt, for confirming the signal transmission direction to prevent any latch.

The bidirectional level shifter 10 operates as thus: when the signal terminal I/O (a) is the input terminal and at a low level, it turns on the switch M2 through the inverter 11 so that the voltage at the signal terminal I/O (b) is equal to the voltage Vp. As the signal terminal I/O(b) being the output terminal, the voltage Vp is judged to be a logic low voltage level, but because the voltage Vp is higher than the voltage Vt, the switch M1 is turned off and no latch problem will occur. When the signal terminal I/O (a) is the input terminal and at a high level, it turns off the switch M2 through the inverter 11, and the voltage at the signal terminal I/O (b) is raised to a high level by the voltage source Vddb; the switch M1 is also turned off and no latch problem will occur. When the signal terminal I/O (b) is the input terminal and at a low level, it turns on the switch M1 through the comparator 12 so that the signal terminal I/O(a) is at a low level close to the ground level. The low level at the signal terminal I/O (a) turns on the switch M2, but the signal terminal I/O (b) is the input terminal and is controlled by the input signal, so the output of the comparator 12 is still at high level. When the signal terminal I/O (b) is the input terminal and at a high level, it turns off the switch M1 through the comparator 12, and the voltage of the signal terminal I/O(a) is raised to a high level by the voltage source Vdda to turn off the switch M2.

The above prior art has the drawback that a regulator circuit is required to provide the voltage Vp in the bidirectional level shifter 10, but the regulator circuit occupies a large area in an IC chip and consumes current, and the NMOS switch in the regulator circuit requires a large area to reduce its body effect. Therefore, a simple and effective solution for reducing the circuit area and improving the operation efficiency is important and desired.

SUMMARY OF THE INVENTION

In a perspective of the present invention, a bidirectional level shifter is provided. The bidirectional level shifter includes: a first signal terminal; a second signal terminal; a first switch, coupled between the first signal terminal and a ground level, for controlling a conduction status between the first signal terminal and the ground level; an inverter, for receiving a signal from the first signal terminal through a first common node, and transmitting a control signal according to the received signal; a Schottky diode, including an anode and a cathode, the anode receiving a signal from the second signal terminal through a second common node; a second switch, coupled between the cathode of the Schottky diode and the ground level, for controlling a conduction status between the cathode of the Schottky diode and the ground level according to the control signal; a comparing circuit, including an input terminal coupled to a reference voltage and another input terminal coupled to the second signal terminal through the second common node, for controlling the first switch according to a comparing result between the two input terminals, wherein the reference voltage is lower than a forward bias voltage of the Schottky diode; a first voltage source, coupled to the first common node, for raising a voltage at the first common node when the voltage at the first common node is not controlled by any other part of the bidirectional level shifter; and a second voltage source, coupled to the second common node, for raising a voltage at the second common node when the voltage at the second common node is not controlled by any other part of the bidirectional level shifter.

In a preferable embodiment of the present invention, a first resistor is coupled between the first common node and the first voltage source, and a second resistor is coupled between the second common node and the second voltage source.

In a preferable embodiment, a third switch is coupled between the first common node and the first voltage source, and a fourth switch is coupled between the second common node and the second voltage source.

In a preferable embodiment of the present invention, a parallel circuit of a first resistor and a third switch is coupled between the first common node and the first voltage source, and a parallel circuit of a second resistor and a fourth switch is coupled between the second common node and the second voltage source.

In a preferable embodiment of the present invention, a noise filter is coupled between the inverter and the second switch, and/or another noise filter is coupled between the first switch and the comparing circuit.

In a preferable embodiment of the present invention, the noise filter is a debouncing circuit.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustrative purpose only, but not drawn according to actual scale. The orientation wordings in the description such as: above, under, left, or right are for reference with respect to the drawings, but not for limiting the actual product made according to the present invention.

Figure 2:
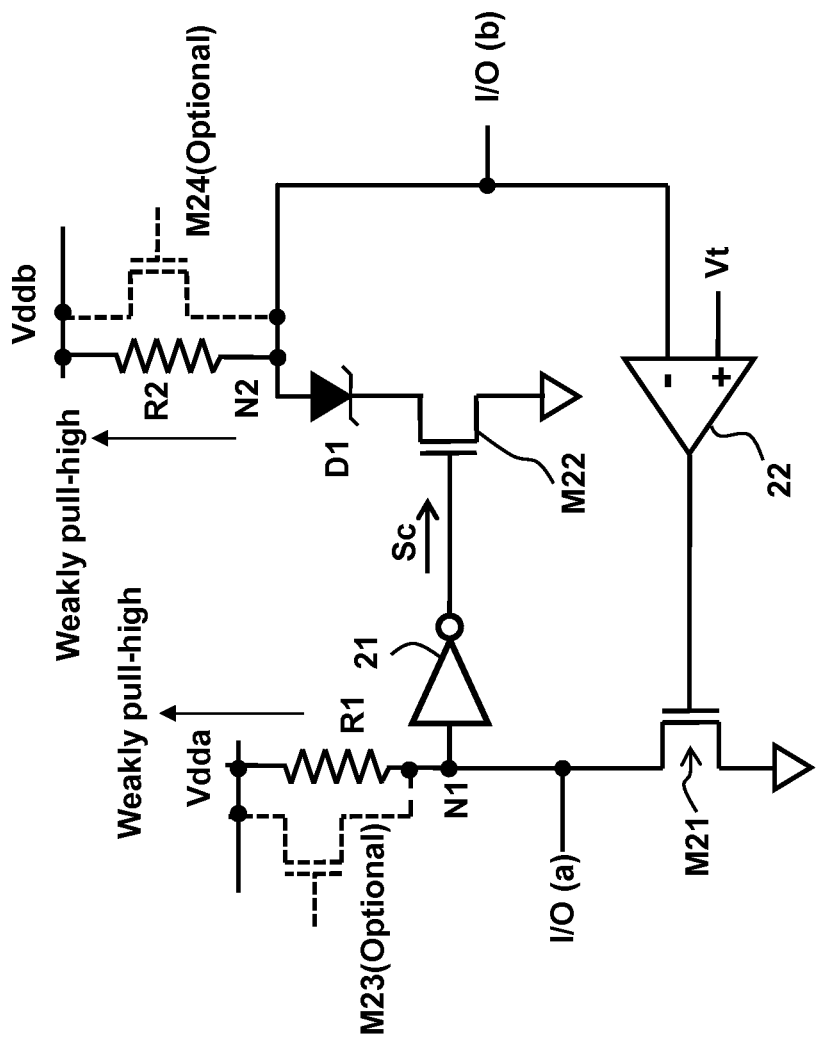
FIG. 2 shows a preferable embodiment of the bidirectional level shifter according to the present invention.

FIG. 2 shows an embodiment of the bidirectional level shifter 20 according to a perspective of the present invention, which can be used for bidirectional serial data transmission. The bidirectional level shifter 20 includes: a first signal terminal I/O(a); a second signal terminal I/O(b); a first switch M21, coupled between the first signal terminal I/O (a) and a ground level, to control a conduction status between the first signal terminal I/O(a) and the ground level; an inverter 21, receiving a signal from the first signal terminal I/O(a) through a first common node N1, and transmitting a control signal Sc according to the received signal; a Schottky diode D1, including an anode and a cathode, the anode receiving a signal from the second signal terminal I/O(b) through a second common node N2; a second switch M22, coupled between the cathode of the Schottky diode D1 and the ground level, and controlling a conduction status between the cathode of the Schottky diode D1 and the ground level according to the control signal Sc; a comparing circuit 22, including an input terminal coupled to a reference voltage Vt and another input terminal coupled to the second signal terminal I/O (b) through the second common node N2, for controlling the first switch M21 according to a comparing result between the two input terminals; a first voltage source Vdda, coupled to the first common node N1, for raising the voltage at the first common node N1 when the voltage at the first common node N1 is not controlled by any other part of the circuit; and a second voltage source Vddb, coupled to the second common node N2, for raising the voltage at the second common node N2 when the voltage at the second common node N2 is not controlled by any other part of the circuit. The aforementioned first voltage source Vdda and second voltage source Vddb can be at the same level or different level, and the reference voltage Vt is lower than a forward bias voltage of the Schottky diode D1.

Figure 1:
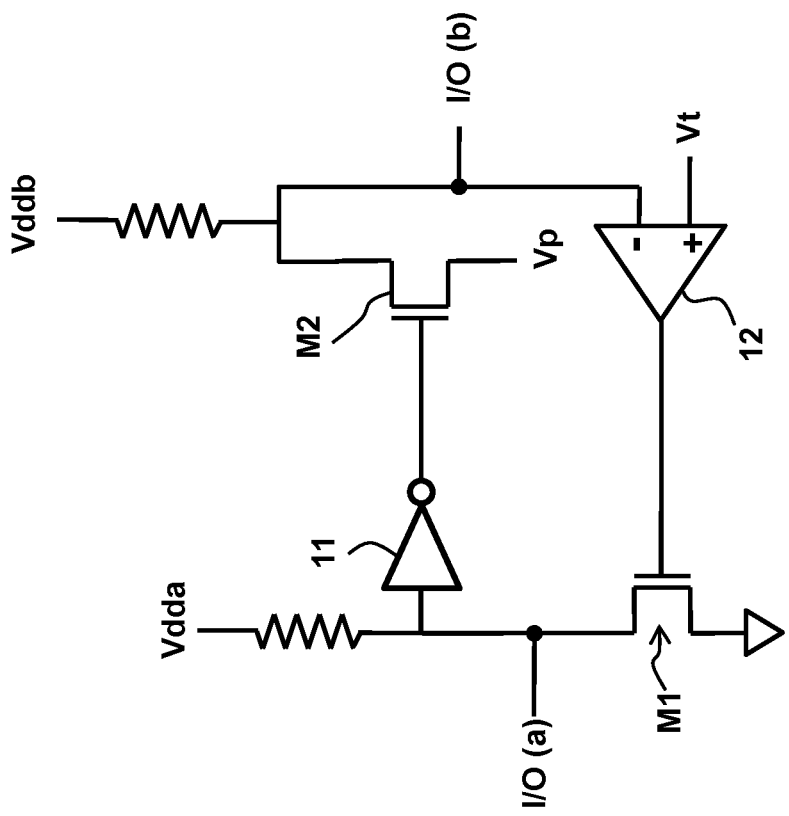
FIG. 1 shows a prior art bidirectional level shifter.

Still referring to FIG. 2, when the second switch M22 is turned on, the Schottky diode D1 provides a forward bias voltage and its function is similar to the voltage Vp of FIG. 1. More specifically, when the first signal terminal I/O(a) is the input terminal and at a low level, it turns on the second switch M22 through the inverter 21, and the output signal of the second signal terminal I/O (b) is the forward bias voltage provided by the Schottky diode. As the second signal terminal I/O(b) being the output terminal, the forward bias voltage at the second signal terminal I/O (b) is judged to be a logic low voltage level. When the first signal terminal I/O (a) is the input terminal and at a high level, it turns off the second switch M22 through the inverter 21, and the voltage at the second common node N2 is not controlled by the Schottky diode D1 or the second signal terminal I/O(b). Because the second common node N2 is coupled to the second voltage source Vddb, the voltage at the second signal terminal I/O(b) is raised to a high level by the second voltage source Vddb due to the weakly pull-high effect provided by the second voltage source Vddb. Thus, the second signal terminal I/O(b) can output a logic high or low signal following the high or low level at the first signal terminal I/O(a). The present invention is different from the prior art in that: the prior art needs a regulator circuit which requires a large area and consumes current, and the NMOS switch therein requires a large area; in contrast, the Schottky diode in the present invention is a low cost, simple, and highly reliable device. Therefore, the present invention is superior to the prior art.

When the second signal terminal I/O(b) is the input terminal and at a low level which is lower than the reference voltage Vt, the comparing circuit 22 turns on the first switch M21 so that the first signal terminal I/O (a) outputs a logic low signal. The low level at the signal terminal I/O (a) turns on the second switch M22, but the second signal terminal I/O (b) is the input terminal and is controlled by the input signal, so the output of the comparing circuit 22 is maintained at high level. When the second signal terminal I/O (b) is the input terminal and at a high level, the comparing circuit 22 turns off the first switch M21, and the first common node N1 is not controlled by the ground level or the first signal terminal I/O(a). Because the first common node N1 is coupled to the first voltage source Vdda, the first signal terminal I/O (a) is raised to a high level by the first voltage source Vdda due to the weakly pull-high effect provided by the first voltage source Vdda. Thus, the first signal terminal I/O(a) can output a logic high or low signal following the high or low level of the second signal terminal I/O(b).

Referring to FIG. 2, in a preferable embodiment, a first resistor R1 is coupled between the first common node N1 and the first voltage source Vdda to function as a pull-up resistor, whose resistance can be decided according to the required current value and response time to raise the voltage level at the common node N1. A second resistor R2 is coupled between the second common node N2 and the second voltage source Vddb; similar to the first resistor R1, the second resistor R2 functions as a pull-up resistor whose resistance can be decided according to the required current value and response time to raise the voltage level at the common node N2.

FIG. 2 shows that the bidirectional level shifter 20 can further include a third switch M23 or a fourth switch M24, for quickly pulling up the voltage at the first signal terminal I/O(a) or the voltage at the second signal terminal I/O(b) to a target voltage level by turning on the third switch M23 or the fourth switch M24 if necessary. For example, the third switch M23 or the fourth switch M24 can operate as thus. First, it is judged whether the first signal terminal I/O (a) or the second signal terminal I/O (b) is the input terminal, and the control signal Sc is compared with a predetermined voltage level or the output of the comparing circuit 22 is compared with a predetermined voltage level, to determine whether the third switch M23 or the fourth switch M24 should be turned on. More specifically, if the first signal terminal I/O(a) is the input terminal and the output of the comparing circuit 22 is at the low level, the third switch M23 can be turned on. If the second signal terminal I/O (b) is the output terminal and the control signal Sc is at the low level, the fourth switch M24 can be turned on.

In another embodiment, the first resistor R1 and the second resistor R2 can be omitted and replaced by the third switch M23 and the fourth switch M24. In detail, if the first signal terminal I/O (a) is the input terminal, the third switch M23 is turned off. If the first signal terminal I/O (a) is the output terminal and the output of the comparing circuit 22 is at the high level, the third switch M23 is also turned off. If the first signal terminal I/O(a) is the output terminal and the output of the comparing circuit 22 is at the low level, the third switch M23 is turned on. If the second signal terminal I/O (b) is the input terminal, the fourth switch M24 is turned off. If the second signal terminal I/O (b) is the output terminal and the control signal Sc is at the high level, the fourth switch M24 is turned off. If the second signal terminal I/O(b) is the output terminal and the control signal Sc is at the low level, the fourth switch M24 is turned on.

Figure 3:
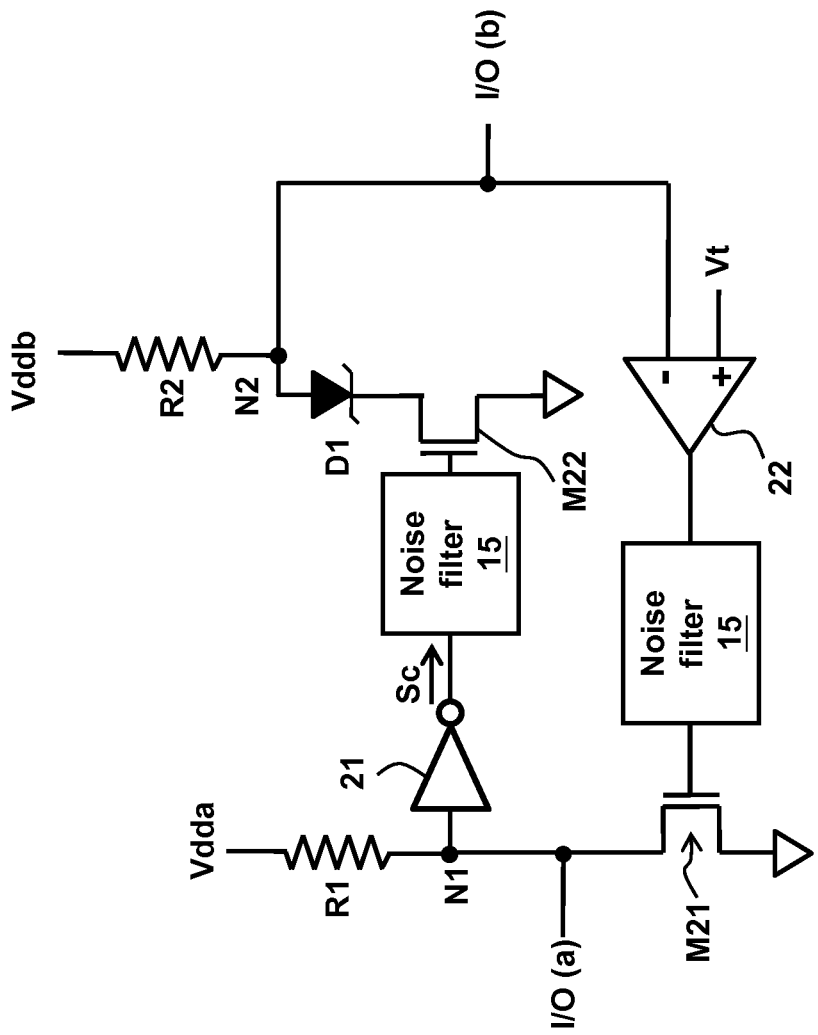
FIG. 3 shows another preferable embodiment of the bidirectional level shifter according to the present invention.

FIG. 3 shows another embodiment of a bidirectional level shifter 30. The main difference between FIG. 2 and FIG. 3 is that a noise filter 15 is coupled between the inverter 21 and the second switch M22, and/or another noise filter 15 is coupled between the first switch M21 and the comparing circuit 22. The purpose of the noise filter 15 is to filter the possible noise in the control signal outputted from the inverter 21 or the possible noise in the output signal from the comparing circuit 22. In one embodiment, the noise filter 15 is a debouncing circuit; it can be other noise filters according to practical need.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the positive terminal and the negative terminals of the comparing circuit are interchangeable, with corresponding modification to a circuit processing or related to the outout of the comparing circuit. The NMOS transistor shown in the embodiment can be replaced by a PMOS transistor. A circuit or device which does not affect the primary function can be inserted between two units shown to be in direct connection in the figures. An embodiment or a claim of the present invention does not need to attain or include all the objectives, advantages or features described in the above. The abstract and the title are provided for assisting searches and not to be read as limitations to the scope of the present invention.

What is claimed is:

1. A bidirectional level shifter, comprising:
   a first signal terminal;
   a second signal terminal;
   a first switch, coupled between the first signal terminal and a ground level, for controlling a conduction status between the first signal terminal and the ground level;
   an inverter, for receiving a signal from the first signal terminal through a first common node, and transmitting a control signal according to the received signal;
   a Schottky diode, including an anode and a cathode, the anode receiving a signal from the second signal terminal through a second common node;
   a second switch, coupled between the cathode of the Schottky diode and the ground level, for controlling a conduction status between the cathode of the Schottky diode and the ground level according to the control signal;
   a comparing circuit, including an input terminal coupled to a reference voltage and another input terminal coupled to the second signal terminal through the second common node, for controlling the first switch according to a comparing result between the two input terminals, wherein the reference voltage is lower than a forward bias voltage of the Schottky diode;
   a first voltage source, coupled to the first common node, for raising a voltage at the first common node when the voltage at the first common node is not controlled by any other part of the bidirectional level shifter; and
   a second voltage source, coupled to the second common node, for raising a voltage at the second common node when the voltage at the second common node is not controlled by any other part of the bidirectional level shifter.

2. The bidirectional level shifter of claim 1, further comprising a first resistor coupled between the first common node and the first voltage source, and a second resistor coupled between the second common node and the second voltage source.

3. The bidirectional level shifter of claim 1, further comprising a third switch coupled between the first common node and the first voltage source, and a fourth switch coupled between the second common node and the second voltage source.

4. The bidirectional level shifter of claim 1, further comprising a first parallel circuit of a first resistor and a third switch, the first parallel circuit being coupled between the first common node and the first voltage source, and a second parallel circuit of a second resistor and a fourth switch, the second parallel circuit being coupled between the second common node and the second voltage source.

5. The bidirectional level shifter of claim 1, further comprising a noise filter coupled between the inverter and the second switch.

6. The bidirectional level shifter of claim 5, wherein the noise filter is a debouncing circuit.

7. The bidirectional level shifter of claim 1, further comprising a noise filter coupled between the first switch and the comparing circuit.

8. The bidirectional level shifter of claim 7, wherein the noise filter is a debouncing circuit.

* * * * *